United States Patent [19]

Schuchmann et al.

[11] Patent Number: 5,729,183
[45] Date of Patent: Mar. 17, 1998

[54] TUNED GUARD CIRCUIT FOR CONDUCTIVE TRANSMISSION LINES ON A PRINTED CIRCUIT BOARD

[75] Inventors: Erik A. Schuchmann; Stuart W. Hayes; Joseph A. Vivio, all of Austin, Tex.

[73] Assignee: Dell USA, L.P., Round Rock, Tex.

[21] Appl. No.: 757,359

[22] Filed: Nov. 27, 1996

[51] Int. Cl.$^6$ ................................................ H01P 5/00
[52] U.S. Cl. .............................. 333/1; 333/12; 333/33
[58] Field of Search .................................. 333/1, 12, 33, 333/246; 14/32, 253; 361/766, 782

[56] References Cited

U.S. PATENT DOCUMENTS

| | | | |
|---|---|---|---|
| 3,179,904 | 4/1965 | Paulsen | 333/1 |
| 3,560,893 | 2/1971 | Wen | 333/24.1 |
| 3,990,024 | 11/1976 | Hou | 333/33 |
| 4,045,750 | 8/1977 | Marshall | 333/100 |
| 4,091,430 | 5/1978 | Berard | 361/43 |
| 4,675,620 | 6/1987 | Fullerton | 333/1 |
| 4,733,209 | 3/1988 | Painting | 333/246 X |
| 5,027,088 | 6/1991 | Shimizu et al. | 333/1 |
| 5,140,288 | 8/1992 | Grunwell | 333/34 |
| 5,208,560 | 5/1993 | Yasutake | 333/12 |
| 5,285,017 | 2/1994 | Gardner | 174/261 |
| 5,294,751 | 3/1994 | Kamada | 333/246 X |
| 5,502,644 | 3/1996 | Hamilton et al. | 364/488 |
| 5,528,202 | 6/1996 | Moline et al. | 333/33 |

*Primary Examiner*—Paul Gensler
*Attorney, Agent, or Firm*—Skjerven, Morrill, MacPherson, Franklin & Friel; M. Kathryn Braquet Tsirigotis

[57] ABSTRACT

The present application describes a tuned guard circuit device and method for controlling impedance levels of transmission lines on a printed circuit board having at least one ground plane and at least two circuit components coupled by a conductive transmission line. The guard circuit device of the present invention includes two etched conducting guard bands on the printed circuit board disposed on opposite sides of a selected transmission line and affixed in a spaced parallel relation to the transmission line. The guard bands are of substantially constant width and substantially constant distance from the ground plane and have substantially the same length as the transmission line, and each guard band has a first and a second terminal end. Also included is a capacitor connected to the ground plane and connected at each of the first and second terminal ends of each guard band wherein the guard bands are connected to ground through the capacitors. The guard circuit device controls the impedance level of the transmission line by varying the capacitance values of the capacitors to optimize the impedance level of the transmission line. The capacitance values of all the capacitors are, preferably, equal.

15 Claims, 1 Drawing Sheet

TUNED GUARD CIRCUIT FOR CONDUCTIVE TRANSMISSION LINES ON A PRINTED CIRCUIT BOARD

BACKGROUND OF THE INVENTION

1. Field of the Invention

This invention relates to high frequency transmission systems and in particular optimizing impedance reduction of the transmission lines on a printed circuit board.

2. Description of the Related Art

Printed circuit boards for electronic circuits are widely used in almost every electronic field today. The electronic circuits on the printed circuit boards, particularly computer and instrumentation circuits, have in recent years become increasingly powerful and fast. Present day computer circuits are many times, and in cases, several orders of magnitude faster than their prior generation counterparts. Higher speed design has increased the impedance tolerance requirements for transmission lines on the printed circuit boards. Maintaining impedance tolerance on a printed circuit board with many high speed subsystems, each having unique requirements, can be difficult. In order to enhance the speed and performance of high speed electronic circuits, ground planes have been used to improve the propagation of signals along electrical pathways. Ground planes are desirable in high frequency electronic circuitry because they help control the impedance presented to a signal propagating along a wire, thereby reducing crosstalk and reflections. The distance between the signal layers and ground plane is used to control the impedance. Another method used for controlling impedance is varying transmission line or trace width. However, there are disadvantages to these methods such as, the ground plane is constant across an entire layer prohibiting individualistic optimizing of impedance, levels for different transmission lines. A disadvantage to varying trace width is that the change in trace width necessary to produce a significant impedance change is too great to be practical. When trace spacing is not available to reduce signal crosstalk, guard bands may be used. On a high impedance trace, with narrow trace widths, the guards bands will be closer than the ground plane, thus reducing the preferred impedance without changing the impedance across the board. However, this method is not flexible and gives a result similar to use of the ground plane to control impedance.

A common and serious problem in the performance of printed circuit boards and aggravated by high impedance boards is crosstalk or unwanted noise passing between nearby transmission lines or conductors belonging to parts of the circuitry that should be electrically isolated from each other. Denser signal conductor routing, use of thinner dielectric between layers, and higher signal propagation speeds all compound the problem.

SUMMARY OF THE INVENTION

The present application describes a tuned guard circuit device and method for controlling impedance levels of transmission lines on a printed circuit board having at least one ground plane and at least two circuit components coupled by a conductive transmission line. The guard circuit device of the present invention includes two etched conducting guard bands on the printed circuit board disposed on opposite sides of a selected transmission line and affixed in a spaced parallel relation to the transmission line. The guard bands are of substantially constant width and substantially constant distance from the ground plane and have substantially the same length as the transmission line, and each guard band has a first and a second terminal end. Also included is a capacitor connected to the ground plane and connected at each of the first and second terminal ends of each guard band wherein the guard bands are connected to ground through the capacitors. The guard circuit device controls the impedance level of the transmission line by varying the capacitance values of the capacitors to optimize the impedance level of the transmission line. The capacitance values of all the capacitors are, preferably, equal.

The present invention, which includes the use of capacitors on the guard bands, allows the guard circuit device to be tuned to optimize the impedance reduction level for each selected individual transmission line. The present invention provides advantages of flexibility wherein the impedance can be tuned closely per individual transmission line and the tuning can be performed after the printed circuit board is fabricated and assembled.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
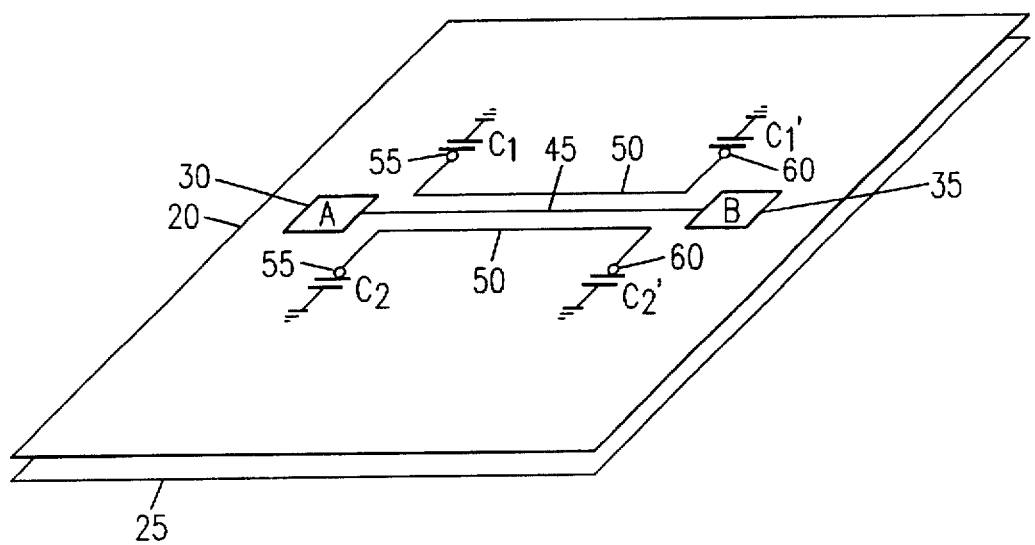
FIG. 1 is a schematic illustration of the guard circuit device of the present invention.

FIG. 1 is a schematic diagram illustrating the guard circuit device of the present invention for use on a printed circuit board 20 having at least one ground plane 25 and at least two circuit components, component A 30 and component B 35, coupled by a conductive transmission line 45 (or trace path). The guard circuit device includes two etched conducting guard bands 50 (or conductive traces) on the printed circuit board 20 disposed on opposite sides of the transmission line 45 and affixed in a spaced parallel relation to the transmission line 45. The guard bands 50 are of substantially constant width and substantially constant distance from the ground plane and have substantially the same length as the transmission line 45, and each guard band 50 has a first and a second terminal end 55 and 60, respectively. The guard bands 50 are of a microstrip surface etched configuration or a stripline buried etched configuration, such configurations being well known n the art.

Also included are capacitors $C_1$ and $C_2$ coupled to the ground plane 25 and connected to the first terminal end 55 of each guard band 50, and $C_1'$ and $C_2'$ coupled to the ground plane 25 and connected to the second terminal end 60 of each guard band 50 so that the guard bands 50 are connected to the ground plane 25 through the capacitors $C_1$, $C_1'$, $C_2$ and $C_2'$. The guard circuit device controls the impedance level of the transmission line 45 by varying the capacitance values of the capacitors $C_1$, $C_1'$, $C_2$ and $C_2'$, preferably to optimize the impedance reduction level of the transmission line 45. The capacitance values of the capacitors $C_1$, $C_1'$, $C_2$ and $C_2'$, preferably, remain equal in value for optimizing the impedance levels.

One problem addressed by the guard circuit device of the present invention is signal crosstalk. The guard circuit device of the present invention reduces crosstalk between the transmission line 45 and other transmission lines (not shown) on the printed circuit board 20, and the capacitors $C_1$, $C_1'$, $C_2$ and $C_2'$ are variable for optimizing the crosstalk reduction.

The method of the present invention includes varying the impedance of selected transmission lines or conductive traces on a printed circuit board 20. The guard bands 50 are fabricated on the printed circuit board 20 disposed on opposite sides of a selected transmission lines 45 as described previously. A desired impedance level is selected for each transmission line 45 and the impedance level of the transmission line 45 is closely tuned and controlled by varying the capacitance value of the capacitors $C_1$, $C_1'$, $C_2$ and $C_2'$ connected to the guard bands 50 to obtain the desired impedance level. The tuning step is preferably performed after the printed circuit board 20 is fabricated and assembled and includes testing for and measuring the impedance level of the transmission line 45 while the capacitance value of the capacitors $C_1$, $C_1'$, $C_2$ and $C_2'$ is varied to obtain the desired impedance level. The capacitance is varied by either exchanging the capacitors $C_1$, $C_1'$, $C_2$ and $C_2'$ with capacitors of a different capacitance value until the desired impedance level is obtained or using adjustable capacitors and adjusting the capacitance until the desired impedance level is obtained.

Figure 2:
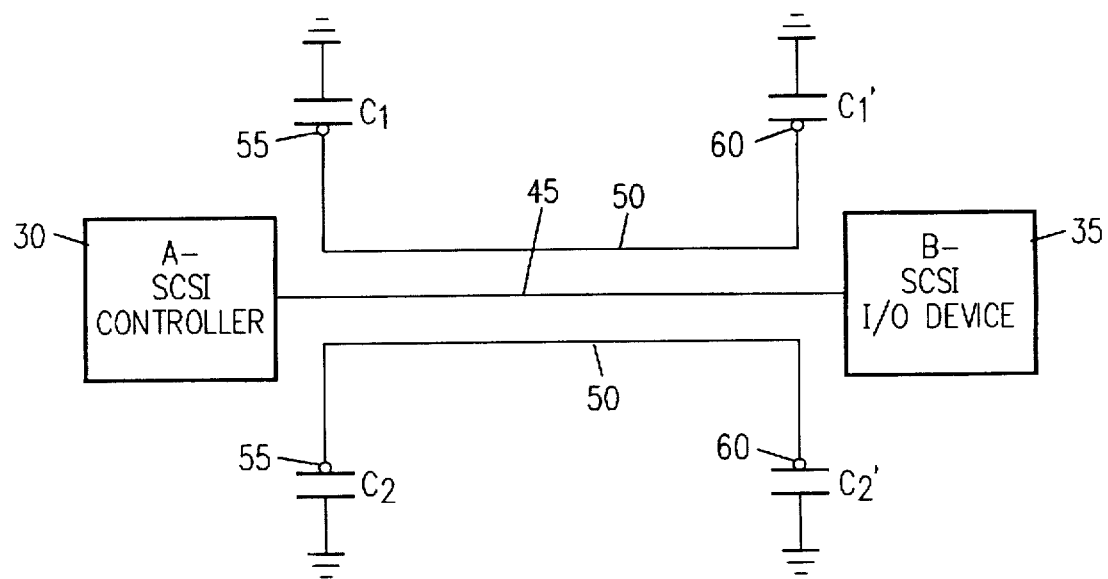
FIG. 2 is a schematic illustration of the guard circuit device of the present invention used, for example, in a computer system.

The guard circuit device and method for impedance reduction is well suited for printed circuit boards used in computer systems such as, for example, printed circuit boards of a small computer system interface (SCSI) which uses high signal speed electronic circuitry to connect microcomputers with peripherals or other computers and local area networks. FIG. 2 is a schematic illustration of the guard circuit device of the present invention Used in a computer system SCSI. For example, component A 30 can be any "driving component" such as a Pentium Pro® microprocessor or a SCSI controller driver (as shown in FIG. 2). Component B 35 can be any "driven component" such as a bridge chip, I/O logic device or SCSI device (as shown in FIG. 2). For simplicity, only one transmission line 45 or trace of the bus is shown, however, the disclosed structure is replicated for each line of the particular serial bus or parallel bus in which it is employed. Using the device and method of the present invention, the impedance level of each selected transmission line 45 is controlled and varied to an optimum level such as, for example, 85 ohms for the SCSI transmission line 45 shown in FIG. 2 by varying the capacitance value of the capacitors $C_1$, $C_1'$, $C_2$ and $C_2'$. Such tuning or controlling of the impedance levels is performed, preferably, after the printed circuit board 20 has been fabricated and assembled. The tuning ability of the guard circuit device of the present invention provides an advantage of individualistic tuning of impedance levels for individual transmission lines to optimize the impedance level of the printed circuit board for various uses such as impedance matching for SCSI connections.

The present invention accomplishes impedance control and crosstalk reduction on a printed circuit board, allowing impedance to be closely tuned per conductive trace after the printed circuit board is assembled. Although the aforementioned transmission or conductive traces are shown by way of example, they may be composed of not only microstrip lines but also other proper striplines. Also, input and output terminals of a proper circuit may of course be connected to the printed circuit board for a proper purpose.

Other embodiments are within the following claims, and, while only certain preferred features of the invention have been shown by way of illustration, many modifications and changes will occur. It is therefore to be understood that the present claims are intended to cover all such modifications and changes which fall within the true spirit of the invention.

What is claimed is:

1. For use on a printed circuit board having at least one ground plane and at least two circuit components coupled by a conductive transmission line having an impedance, a guard circuit device comprising:

two etched conducting guard bands on said printed circuit board disposed on opposite sides of said transmission line and affixed in a spaced parallel relation to said transmission line, said guard bands being of substantially constant width and substantially constant distance from said ground plane and having substantially the same length as said transmission line, and each guard band having a first and a second terminal end; and a capacitor coupled to said ground plane and connected at each of said first and second terminal ends of each said guard band wherein said guard bands are connected to said ground plane through said capacitors, and wherein said guard circuit device controls the impedance level of said transmission line by varying the capacitance value of said capacitors.

2. The guard circuit device of claim 1 wherein said capacitors are all equal in capacitance value.

3. The guard circuit device of claim 1 wherein said guard circuit device reduces crosstalk between said transmission line and other transmission lines on said printed circuit board by varying the capacitance value of said capacitors.

4. The guard circuit device of claim 1 wherein said etched conducting guard bands are of a microstrip surface etched configuration.

5. The guard circuit device of claim 1 wherein said etched conducting guard bands are of a stripline buried etched configuration.

6. On a printed circuit board having at least one ground plane and a plurality of conductive transmission lines, each transmission line coupling at least two circuit components, a method of controlling the impedance of selected transmission lines, the method comprising the steps of:

fabricating, on said printed circuit board, two etched conducting guard bands disposed on opposite sides of a selected transmission line and affixed in spaced parallel relation to said transmission line, said guard bands being of substantially constant width and substantially constant distance from said ground plane and having substantially the same length as said transmission line, each guard band having a first and a second terminal end and wherein each guard band is connected to said ground plane through a capacitor connected at each of said first and second terminal ends;

selecting a desired impedance level for said transmission line; and tuning the impedance level of said transmission line by varying the capacitance of said capacitors connected to said guard bands to obtain the desired impedance level for said transmission line.

7. The method as set forth in claim 6 wherein the capacitance values said capacitors are all equal.

8. The method as set forth in claim 6 further including:

fabricating said guard bands by a microstrip etching process.

9. The method as set forth in claim 6 further including:

fabricating said guard bands by a stripline etching process.

10. The method as set forth in claim 6 wherein varying the capacitance of said capacitors includes exchanging said capacitors on said guard bands with capacitors of a different capacitance value until the desired impedance level is obtained.

11. The method as set forth in claim 6 wherein varying the capacitance of said capacitors includes connecting adjustable capacitors to said guard bands and adjusting the capacitance until the desired impedance level is obtained.

12. The method as set forth in claim 6 wherein said tuning step includes measuring the impedance level of said transmission line while the capacitance of said capacitors is varied to obtain the desired impedance level.

13. The method as set forth in claim 6 wherein said tuning step is performed after said printed circuit board is assembled.

14. A computer system including a guard circuit device for tuning an impedance level of a printed circuit board, the printed circuit board having at least one ground plane and a plurality of conductive transmission lines, each transmission line coupling at least two circuit components and one or more transmission lines selected for impedance tuning, the guard circuit device comprising:

two etched conducting guard bands on said printed circuit board disposed on opposite sides of each selected transmission line and affixed in a spaced parallel relation to each said transmission line, said guard bands being of substantially constant width and substantially constant distance from said ground plane and having substantially the same length as said transmission line, and each guard band having a first and a second terminal end; and a capacitor coupled to said ground plane and connected to each of said first and second terminal ends of each said guard band wherein said guard bands are connected to said ground plane through said capacitors, and wherein said guard circuit device controls the impedance level of each selected transmission line by varying the capacitance values of said capacitors to optimize the impedance level of said transmission line.

15. The computer system of claim 14 wherein said capacitors are all equal in capacitance value.

* * * * *